(12) United States Patent
Martin et al.

(10) Patent No.: US 7,378,712 B2
(45) Date of Patent: May 27, 2008

(54) GATE STACKS

(75) Inventors: Dale W. Martin, Hyde Park, VT (US); Steven M. Shank, Jericho, VT (US); Michael C. Triplett, Colchester, VT (US); Deborah A. Tucker, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/463,039

(22) Filed: Aug. 8, 2006

(65) Prior Publication Data

US 2007/0194385 A1 Aug. 23, 2007

Related U.S. Application Data

(62) Division of application No. 10/711,742, filed on Oct. 1, 2004, now Pat. No. 7,157,341.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/369; 257/900; 257/E27.06
(58) Field of Classification Search ........ 257/337–338, 257/368–369, 900, E27.06, E27.062
See application file for complete search history.

(56) References Cited

U.S. PATENT DOCUMENTS

| | | | |
|---|---|---|---|
| 5,459,091 A | 10/1995 | Hwang | |
| 5,545,581 A | 8/1996 | Armacost et al. | |
| 5,658,813 A | 8/1997 | Enomoto | |
| 6,143,611 A | 11/2000 | Gilton et al. | |
| 6,194,784 B1 | 2/2001 | Parat et al. | |
| 6,583,441 B2 | 6/2003 | Moradi et al. | |
| 6,911,384 B2 | 6/2005 | Dokumaci et al. | |
| 6,930,362 B1 * | 8/2005 | Mirabedini et al. | 257/412 |
| 2002/0072210 A1 * | 6/2002 | Hsu et al. | 438/595 |
| 2003/0025176 A1 | 2/2003 | Subramanian et al. | |
| 2003/0124802 A1 | 7/2003 | Johnson et al. | |
| 2003/0203581 A1 | 10/2003 | Moradi et al. | |
| 2003/0206429 A2 | 11/2003 | Subramanian et al. | |
| 2004/0227179 A1 * | 11/2004 | Rabkin et al. | 257/315 |
| 2005/0048732 A1 | 3/2005 | Park et al. | |

* cited by examiner

*Primary Examiner*—Hoai v Pham
(74) *Attorney, Agent, or Firm*—Schmeiser, Olsen & Watts; William D. Sabo

(57) ABSTRACT

A gate stack structure. The structure includes (a) a semiconductor region and (b) a gate stack on top of the semiconductor region. The gate stack includes (i) a gate dielectric region on top of the semiconductor region, (ii) a first gate polysilicon region on top of the gate dielectric region, and (iii) a second gate polysilicon region on top of the first gate polysilicon region and doped with a type of dopants. The structure further includes (c) a diffusion barrier region and a spacer oxide region on a side wall of the gate stack. The diffusion barrier region (i) is sandwiched between the gate stack and the spacer oxide region and (ii) is in direct physical contact with both the first and second gate polysilicon regions, and (iii) comprises a material having a property of preventing a diffusion of oxygen-containing materials through the diffusion barrier region.

7 Claims, 3 Drawing Sheets

FIG. 1Dii

GATE STACKS

This application is a divisional of Ser. No. 10/711,742, filed Oct. 1, 2004 now U.S. Pat. No. 7,157,341.

BACKGROUND OF THE INVENTION

1. Technical Field

The present invention relates to gate stacks, and more particularly, to a gate stack of a transistor wherein the top region of the gate stack is less likely to break off than the top region of a typical gate stack during the fabrication of the transistor.

2. Related Art

A typical fabrication process of a transistor can start with the formation of a gate stack on a semiconductor substrate. Then, the gate stack can be used to define the source/drain regions of the transistor in the substrate. Eventually, the gate stack becomes the gate of the transistor. There is always a need to reduce the resistance of the gate of the transistor to improve the performance of the transistor.

Therefore, there is a need for a novel gate stack whose resistance is relatively lower than that of the prior art. Also, there is a need for a method for forming the novel gate stack.

SUMMARY OF THE INVENTION

The present invention provides a method of forming a semiconductor structure, comprising the steps of (a) providing a semiconductor region; (b) forming a gate stack on top of the semiconductor region, the gate stack including (i) a gate dielectric region on top of the semiconductor region, (ii) a first gate polysilicon region on top of the gate dielectric region, and (iii) a second gate polysilicon region on top of the first gate polysilicon region, the second gate polysilicon region being doped with a type of dopants; and (c) forming on a side wall of the gate stack a diffusion barrier region and a spacer oxide region, wherein the diffusion barrier region is sandwiched between the gate stack and the spacer oxide region, and wherein the diffusion barrier region is in direct physical contact with both the first and second gate polysilicon regions.

The present invention also provides a semiconductor structure, comprising (a) a semiconductor region; (b) a gate stack on top of the semiconductor region, the gate stack including (i) a gate dielectric region on top of the semiconductor region, (ii) a first gate polysilicon region on top of the gate dielectric region, and (iii) a second gate polysilicon region on top of the first gate polysilicon region, the second gate polysilicon region being doped with a type of dopants; and (c) a diffusion barrier region and a spacer oxide region on a side wall of the gate stack, wherein the diffusion barrier region is sandwiched between the gate stack and the spacer oxide region, and wherein the diffusion barrier region is in direct physical contact with both the first and second gate polysilicon regions.

The present invention also provides a method of forming a semiconductor structure, comprising the steps of (a) providing a semiconductor substrate; (b) forming a gate stack on top of the semiconductor substrate, the gate stack including (i) a gate dielectric region on top of the semiconductor substrate, (ii) a first gate polysilicon region on top of the gate dielectric region, and (iii) a second gate polysilicon region on top of the first gate polysilicon region, the second gate polysilicon region being heavily doped with a type of dopants; and (c) forming on first and second side walls of the gate stack first and second diffusion barrier regions and first and second spacer oxide regions, respectively, wherein the first diffusion barrier region is sandwiched between the gate stack and the first spacer oxide region, wherein the first diffusion barrier region is in direct physical contact with both the first and second gate polysilicon regions, wherein the second diffusion barrier region is sandwiched between the gate stack and the second spacer oxide region, and wherein the second diffusion barrier region is in direct physical contact with both the first and second gate polysilicon regions.

The present invention provides the advantage of for a novel gate stack whose top region is less likely to break off than the top region of a typical gate stack.

DETAILED DESCRIPTION OF THE INVENTION

Figure 1A:
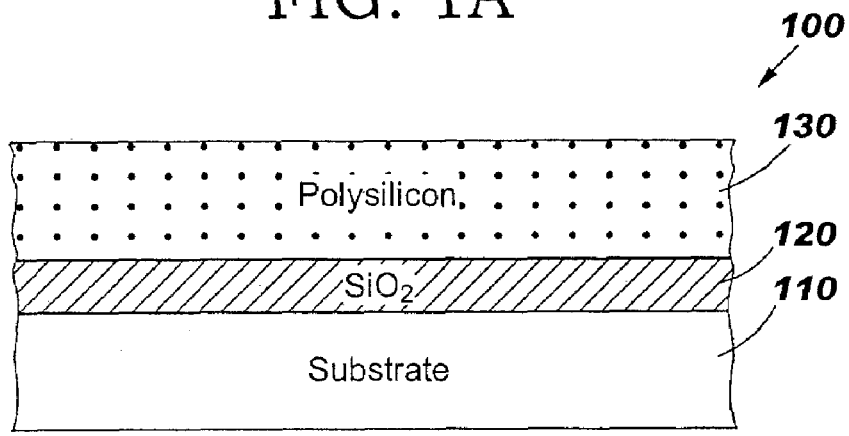
FIGS. 1A-1E illustrate cross-sectional views of a semiconductor structure after each of a series of fabrication steps is performed, in accordance with embodiments of the present invention.

FIG. 1A illustrates a cross-sectional view of the semiconductor structure 100 after a gate dielectric layer 120 and then a gate polysilicon layer 130 are formed on top of a semiconductor (e.g., silicon Si, germanium Ge, a mixture of Si and Ge, etc.) substrate 110, in accordance with embodiments of the present invention. More specifically, the fabrication process of the structure 100 of FIG. 1A starts out with the Si substrate 110. Then, in one embodiment, the gate dielectric layer 120 can be formed by thermally oxidizing a top surface of the Si substrate 110 in a first thermal oxidation step. As a result, the resulting gate dielectric layer 120 comprises silicon dioxide ($SiO_2$). Then, the gate polysilicon layer 130 can be formed by depositing silicon on top of the $SiO_2$ gate dielectric layer 120 using, illustratively, a CVD (chemical vapor deposition) process.

Figure 1B:
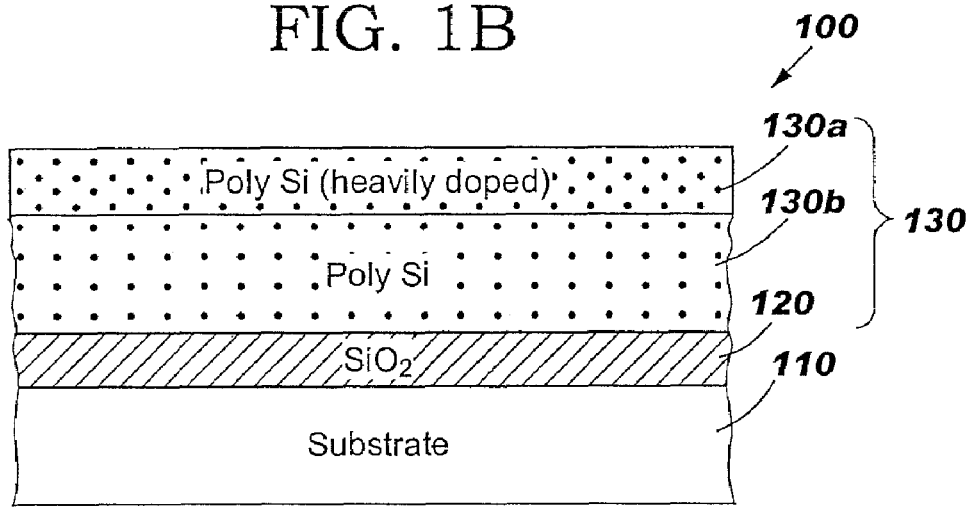

FIG. 1B illustrates a cross-sectional view of the semiconductor structure 100 after a heavily-doped gate polysilicon layer 130a is formed at top of the semiconductor structure 100 of FIG. 1A, in accordance with embodiments of the present invention. More specifically, in one embodiment, dopants of one type (e.g., n-type phosphorous or p-type boron) can be implanted by, illustratively, ion implantation into a top layer 130a of the gate polysilicon layer 130. As a result, the gate polysilicon layer 130 comprises two layers: the heavily-doped gate polysilicon layer 130a and the undoped (or lightly doped) gate polysilicon layer 130b.

Figure 1C:
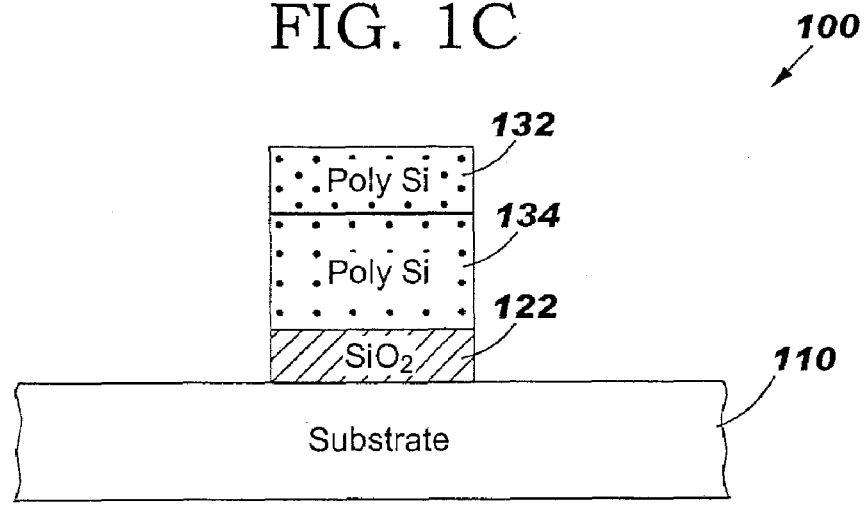

FIG. 1C illustrates a cross-sectional view of the semiconductor structure 100 after portions of the gate polysilicon layer 130 and the gate dielectric layer 120 are removed so as to form a gate stack 132,134,122, in accordance with embodiments of the present invention. More specifically, in one embodiment, a photoresist mask (not shown) is laid on a top surface 135 of the heavily-doped gate polysilicon layer 130a of FIG. 1B. The photoresist mask covers an area of the top surface 135 under which the gate stack 132,134,122 is to be formed. Then, portions of the gate polysilicon layer 130 not covered by the photoresist mask is chemically etched away in a first chemical etching step. Then, portions of the gate dielectric layer 120 not covered by the photoresist mask is chemically etched away a second chemical etching step.

What remains of the gate polysilicon layer 130 and the gate dielectric layer 120 after the first and second chemical etching steps is the gate stack 132,134,122. More specifically, what remains of the heavily-doped gate polysilicon layer 130a after the first chemical etching step is the heavily-doped gate polysilicon region 132. What remains of the undoped gate polysilicon layer 130b after the first chemical etching step is the undoped gate polysilicon region 134. Finally, what remains of the gate dielectric layer 120 after the second chemical etching step is the gate dielectric region 122.

Figure 1D:
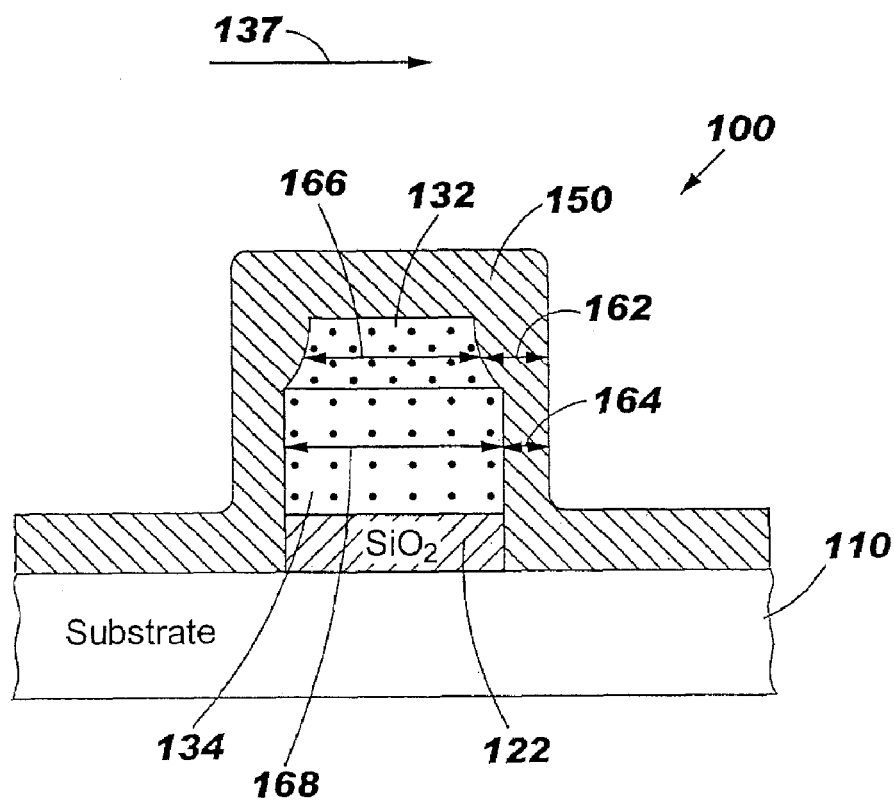
Figure 1D:
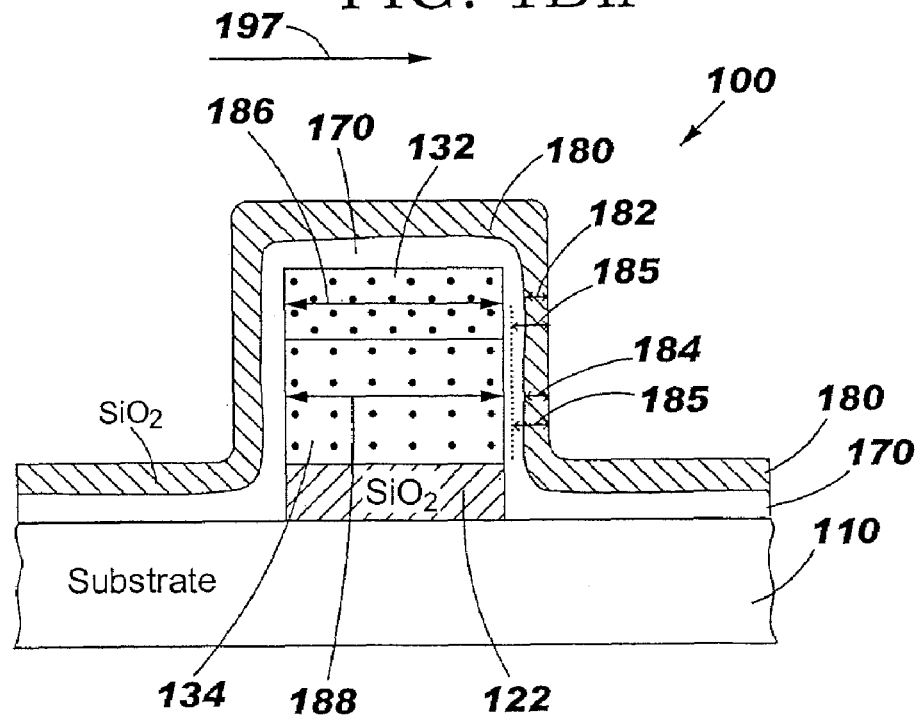

FIG. 1Di illustrates a cross-sectional view of the semiconductor structure 100 after a spacer oxide layer 150 are formed on exposed surfaces of the gate stack 132,134,122 and the substrate 110 of FIG. 1C, in accordance with embodiments of the present invention. More specifically, in one embodiment, the semiconductor structure 100 of FIG. 1C is subjected to a second thermal oxidation step with the presence of oxygen (and/or oxygen-carrying material). As a result, oxygen reacts with silicon to form silicon dioxide $SiO_2$ constituting the spacer oxide layer 150. Assume that the gate polysilicon region 132 is doped with n-type dopants. Because thermal oxidation of n-type doped polysilicon is faster than thermal oxidation of undoped polysilicon, the spacer oxide layer 150 is thicker at the heavily-doped gate polysilicon region 132 than at the undoped gate polysilicon region 134, meaning the thickness 162 is larger than the thickness 164 (FIG. 1Di). As a result, the width 166 (i.e., in direction 137) of the heavily-doped gate polysilicon region 132 is narrower than the width 168 of the undoped gate polysilicon region 134.

FIG. 1Dii illustrates an alternative embodiment of the structure 100 of FIG. 1Dii. FIG. 1Dii illustrates a cross-sectional view of the semiconductor structure 100 after a diffusion barrier layer 170 and a spacer oxide layer 180 are formed on exposed surfaces of the gate stack 132,134,122 and the substrate 110 of FIG. 1C, in accordance with embodiments of the present invention. More specifically, in one embodiment, the semiconductor structure 100 of FIG. 1C is subjected to a third thermal oxidation step with the presence of oxygen (and/or oxygen-carrying material) and a nitrogen-carrying gas (e.g., $N_2O$ or NO). The terms "first", "second", and "third" as used in the first, second, and third thermal oxidation steps refer to three separate, independent thermal oxidation steps and do not necessarily mean that all of the first, second, and third thermal oxidation steps must be performed in one embodiment, or that they must be performed in the order of first, second, and then third. For example, the structure 100 of FIG. 1Dii involves only the first and third thermal oxidation steps (not the second thermal oxidation step). In one embodiment, the third oxidation step with the presence of the nitrogen-carrying gas is performed in a furnace (not shown) at a high temperature, illustratively, in the range of 900° C.-1100° C.

As a result of the third thermal oxidation step, nitrogen atoms diffuse into the gate polysilicon regions 132 and 134 of the gate stack 132,134,122 and reacts with silicon to form oxynitride silicon constituting the diffusion barrier layer 170 at a depth 185. The formation of the diffusion barrier layer 170 is self-limiting, meaning that the just-formed diffusion barrier layer 170 prevents more nitrogen atoms from diffusing through the diffusion barrier layer 170 itself. The diffusion barrier layer 170 also prevents more oxygen atoms (which, in one embodiment, can come from oxygen gas and/used for the third thermal oxidation step) from diffusing through it. As a result, only silicon material above the depth 185 of the diffusion barrier layer 170 are subjected to oxygen and oxidized to form $SiO_2$ constituting the spacer oxide layer 180. As a result, the formation of the spacer oxide layer 180 is limited by (i.e., cannot extend beyond) the diffusion barrier layer 170. In general, in the third thermal oxidation step, the nitrogen-carrying gas can be replaced by any equivalent gas that can react with silicon to form a diffusion barrier layer capable of preventing oxygen and/or oxygen-carrying materials from diffusing through it.

In the embodiments described above, the diffusion barrier layer 170 and the spacer oxide layer 180 are simultaneously formed in the third thermal oxidation step. In an alternative embodiment, the diffusion barrier layer 170 can be formed first, and then the spacer oxide layer 180 is formed. More specifically, in one embodiment, the diffusion barrier layer 170 can be formed by implanting nitrogen in a top layer (not shown) under the exposed surfaces of the regions 132 and 134, and then raising the temperature at the exposed surfaces of the regions 132 and 134 so as to cause the implanted nitrogen to react with silicon of the regions 132 and 134 to form silicon nitride ($Si_3N_4$) constituting the diffusion barrier layer 170. Then, the spacer oxide layer 180 can be formed by depositing $SiO_2$ on top of the diffusion barrier layer 170 using, illustratively, a CVD step. It should be noted that like oxynitride silicon, silicon nitride also prevents oxygen diffusion.

Because doping concentration of polysilicon does not affect the diffusion rate of nitrogen, the oxynitride silicon diffusion barrier layer 170 is formed at the same depth 185 from the exposed surfaces of the gate polysilicon regions 132 and 134. As a result, the thickness 182 of the spacer oxide layer 180 resulting from the oxidation of the n-type doped polysilicon region 132 and the thickness 184 of the spacer oxide layer 180 resulting from the oxidation of the undoped polysilicon region 134 are equal. Because the diffusion barrier layer 170 has the same thickness whether it results from the nitridation of polysilicon of the region 132 or region 134, the widths 186 and 188 (in direction 197) of the polysilicon regions 132 and 134, respectively, are also equal.

Figure 1E:
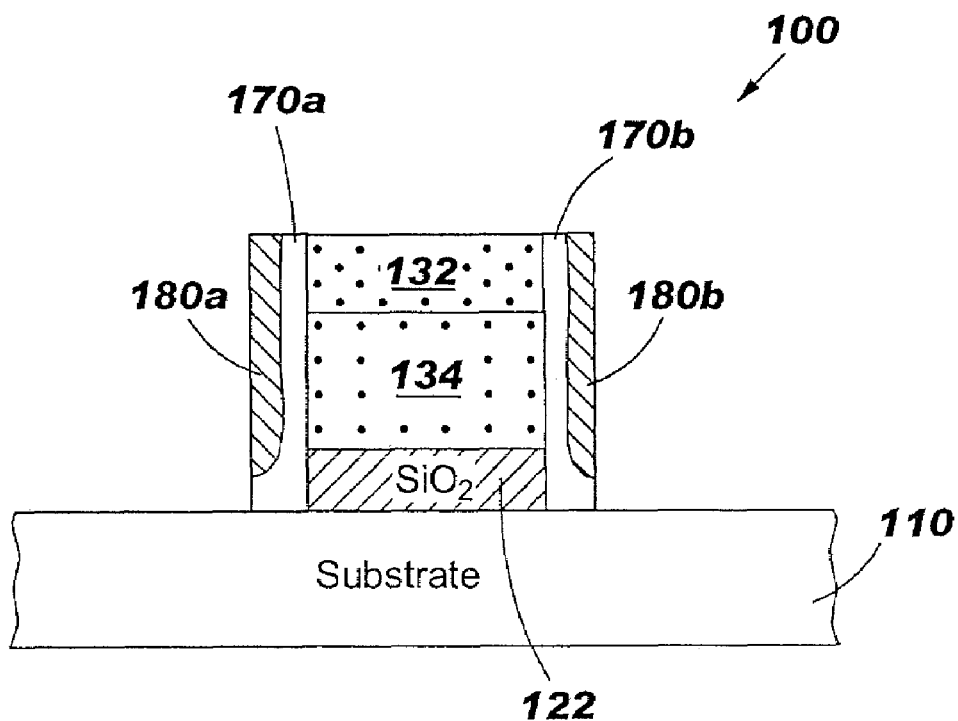

FIG. 1E illustrates a cross-sectional view of the semiconductor structure 100 after top portions of the diffusion barrier layer 170 and the spacer oxide layer 180 above the gate stack 132,134,122 of FIG. 1Dii are removed, in accordance with embodiments of the present invention. More specifically, in one embodiment, the top portions of the diffusion barrier layer 170 and the spacer oxide layer 180 above the gate stack 132,134,122 (FIG. 1Dii) can be removed by, illustratively, a CMP (chemical mechanical polishing) step. What remains of the diffusion barrier layer 170 is the diffusion barrier regions 170a and 170b, and what remains of the spacer oxide layer 180 is the spacer oxide regions 180a and 180b. The spacer oxide regions 180a and 180b can be used to define source/drain regions (not shown) in the substrate 110.

Figure 2:
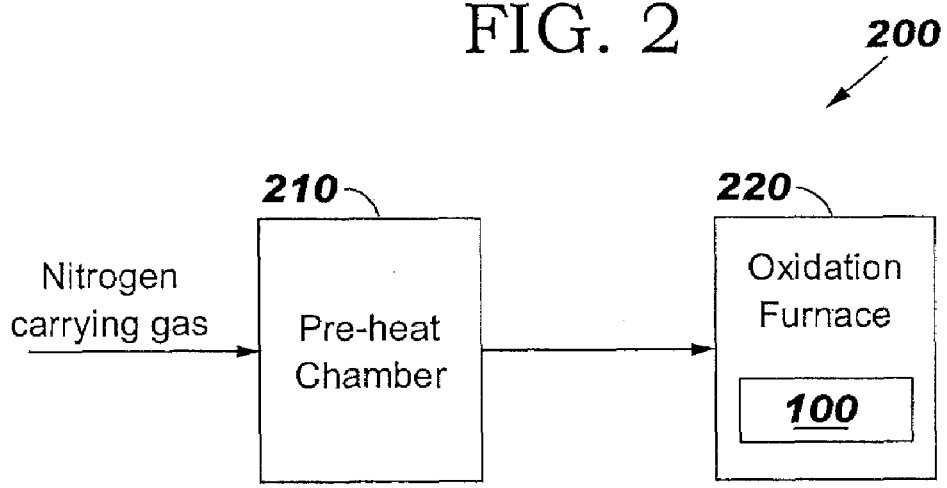

FIG. 2 illustrates an oxidation system 200 for performing the third oxidation step described supra with respect to FIG. 1Dii. Illustratively, the oxidation system 200 comprises a pre-heat chamber 210 and an oxidation furnace 220 containing the structure 100 of FIG. 1C. In one embodiment, the nitrogen-carrying gas is first heated up in the pre-heat chamber 210 to a high temperature (700° C.-900° C.). Then, the pre-heated nitrogen-carrying gas is led to the oxidation furnace 220. In the oxidation furnace 220, the top surfaces of the structure 100 is also heated to 700° C.-900° C. At this temperature range, the third oxidation step occurs as described supra. It should be noted that as a result of the pre-heating of the nitrogen-carrying gas in the pre-heat chamber 210, some $N_2O$ in the nitrogen-carrying gas is converted to NO, which is more active than $N_2O$. Therefore, the third oxidation step can be carried out in the oxidation furnace 220 at a lower temperature than without the preheating step (i.e., at 700° C.-900° C. as opposed to 900° C.-1100° C.).

In summary, as a result of the third thermal oxidation of the gate stack 132,134,122 with the presence of the nitrogen-carrying gas, the thin diffusion barrier layer 170 is formed at a same depth 185 in the gate polysilicon regions 132 and 134 regardless of doping concentration. Therefore, the resulting gate polysilicon regions 132 and 134 have equal widths 186 and 188, respectively (FIG. 1Dii). As a result, the region 132 of FIG. 1Dii is less likely to break off than the case of FIG. 1Di during ensuing fabrication steps (e.g., a chemical mechanical polishing step).

In the embodiments described above, the gate polysilicon region 134 is undoped. In general, the gate polysilicon region 134 can be lightly doped with either n-type or p-type dopants or both.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
   (a) a semiconductor region;
   (b) a gate stack on top of the semiconductor region, the gate stack including
      (i) a gate dielectric region on top of the semiconductor region,
      (ii) a first gate polysilicon region on top of the gate dielectric region, and
      (iii) a second gate polysilicon region on top of the first gate polysilicon region, the second gate polysilicon region being doped;
   (c) a dielectric spacer layer in direct physical contact with the semiconductor region, the gate dielectric region, and the first and second gate polysilicon regions,
      wherein a reference direction is defined as being perpendicular to a first common interfacing surface of the first gate polysilicon region and the dielectric spacer layer and being parallel to a second common interfacing surface of the gate dielectric region and the semiconductor region,
      wherein a first thickness in the reference direction of the dielectric spacer layer measured through a first point of the dielectric spacer layer is less than a second thickness in the reference direction of the dielectric spacer layer measured through a second point of the dielectric spacer layer,
      wherein a first straight line goes through both the first point of the dielectric spacer layer and a third point inside the first gate polysilicon region and is parallel to the reference direction, and
      wherein a second straight line goes through both the second point of the dielectric spacer layer and a fourth point inside the second gate polysilicon region and is parallel to the reference direction.

2. The semiconductor structure of claim 1,
   wherein the second gate polysilicon region is doped with n-type dopants, and
   wherein the first gate polysilicon region is undoped.

3. The semiconductor structure of claim 1, wherein the first gate polysilicon region is undoped.

4. The semiconductor structure of claim 1, wherein a first width in the reference direction of the first gate polysilicon region is greater than a second width in the reference direction of the second gate polysilicon region.

5. The semiconductor structure of claim 1, wherein the dielectric spacer layer comprises silicon dioxide.

6. The semiconductor structure of claim 5, wherein the gate dielectric region comprises silicon dioxide.

7. The semiconductor structure of claim 6,
   wherein the second gate polysilicon region is doped with n-type dopants, and
   wherein the first gate polysilicon region is undoped.

* * * * *